United States Patent
Guimard et al.

(10) Patent No.: US 10,457,590 B2
(45) Date of Patent: *Oct. 29, 2019

(54) SUBSTRATE PROVIDED WITH A STACK HAVING THERMAL PROPERTIES COMPRISING AT LEAST ONE NICKEL OXIDE LAYER

(71) Applicant: SAINT-GOBAIN GLASS FRANCE, Courbevoie (FR)

(72) Inventors: Denis Guimard, Paris (FR); Silvia Mariani, Paris (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/780,884

(22) PCT Filed: Dec. 1, 2016

(86) PCT No.: PCT/FR2016/053171
§ 371 (c)(1),
(2) Date: Jun. 1, 2018

(87) PCT Pub. No.: WO2017/093676
PCT Pub. Date: Jun. 8, 2017

(65) Prior Publication Data
US 2018/0282206 A1    Oct. 4, 2018

(30) Foreign Application Priority Data
Dec. 2, 2015    (FR) .................................... 15 61721

(51) Int. Cl.
B32B 15/04    (2006.01)
B32B 17/06    (2006.01)
(Continued)

(52) U.S. Cl.
CPC .......... *C03C 17/3644* (2013.01); *C03C 17/36* (2013.01); *C03C 17/366* (2013.01);
(Continued)

(58) Field of Classification Search
USPC ................ 428/426, 428, 432, 434, 701, 702
See application file for complete search history.

(56) References Cited

U.S. PATENT DOCUMENTS 7,597,962 B2 * 10/2009 Butz ....................... C03C 17/36
428/432
2002/0021495 A1    2/2002 Lingle
(Continued)

FOREIGN PATENT DOCUMENTS

WO    WO 2015/067895 A1    5/2015

OTHER PUBLICATIONS

International Search Report dated Feb. 8, 2017 in PCT/FR2016/053171 filed Dec. 1, 2016.

*Primary Examiner* — Lauren R Colgan
(74) *Attorney, Agent, or Firm* — Oblon, McClelland, Maier & Neustadt, L.L.P.

(57) ABSTRACT

A transparent substrate is provided, on a main face, with a stack of thin layers including at least one metallic functional layer having properties of reflection in the infrared region and/or in the solar radiation region, based on silver or on silver-containing metal alloy, and two antireflective coating. The antireflective coatings each include at least one dielectric layer. The functional layer is positioned between the two antireflective coatings. Additionally, at least one nickel oxide $Ni_xO$ layer is located on and in contact with the functional layer starting with the substrate. A physical thickness of the nickel oxide $Ni_xO$ layer is at least 0.3 nm.

20 Claims, 2 Drawing Sheets

Figure 1:
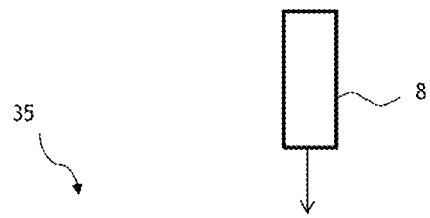
Figure 1:
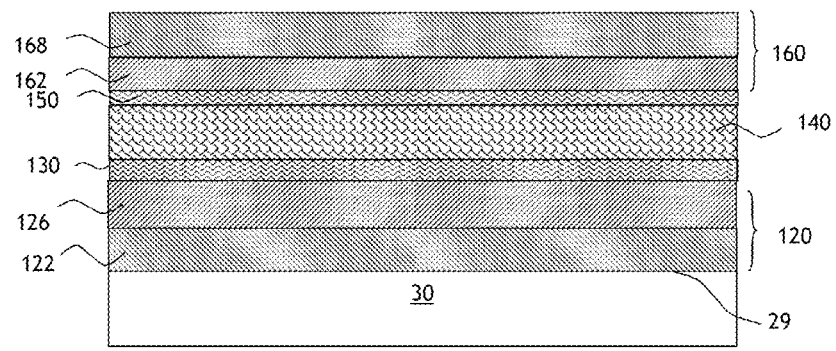

(51) Int. Cl.
*C03C 17/36* (2006.01)
*H05B 3/84* (2006.01)
*G02F 1/1343* (2006.01)
*G02F 1/155* (2006.01)
*H01L 31/0216* (2014.01)

(52) U.S. Cl.
CPC ........... *C03C 17/3652* (2013.01); *H05B 3/84* (2013.01); *C03C 2217/73* (2013.01); *C03C 2218/154* (2013.01); *C03C 2218/155* (2013.01); *G02F 1/13439* (2013.01); *G02F 1/155* (2013.01); *H01L 31/02168* (2013.01)

(56) References Cited

U.S. PATENT DOCUMENTS

| | | |
|---|---|---|
| 2002/0192474 A1 | 12/2002 | Lingle |
| 2003/0104221 A1* | 6/2003 | Stachowiak ............ C03C 17/36 428/432 |
| 2003/0150711 A1 | 8/2003 | Laird |
| 2005/0025917 A1 | 2/2005 | Laird et al. |
| 2005/0042460 A1* | 2/2005 | Kriltz ................ B32B 17/10174 428/432 |
| 2005/0164015 A1 | 7/2005 | Laird et al. |
| 2006/0046072 A1 | 3/2006 | Ferreira et al. |
| 2007/0128451 A1 | 6/2007 | Ferreira et al. |
| 2011/0284366 A1 | 11/2011 | Laird et al. |
| 2013/0323514 A1 | 12/2013 | Laird et al. |
| 2016/0244361 A1 | 8/2016 | Rondeau et al. |

* cited by examiner

SUBSTRATE PROVIDED WITH A STACK HAVING THERMAL PROPERTIES COMPRISING AT LEAST ONE NICKEL OXIDE LAYER

The invention relates to a transparent substrate in particular made of a rigid mineral material, such as glass, said substrate being coated with a stack of thin layers comprising a functional layer of metallic type which can influence solar radiation and/or long wavelength infrared radiation.

The invention more particularly relates to the use of such substrates for manufacturing thermal insulation and/or solar protection glazings. These glazings may be intended to equip both buildings and vehicles, in particular with a view to reducing the air-conditioning load and/or preventing excessive overheating ("solar control" glazings) and/or reducing the amount of energy dissipated toward the outside ("low-e" glazings) driven by the ever increasing importance of glazed surfaces in buildings and vehicle compartments.

These glazings can furthermore be incorporated in glazings having specific functionalities, such as, for example, heated glazings or electrochromic glazings.

One type of stack of layers known for conferring such properties on substrates consists of a metallic functional layer having properties of reflection in the infrared region and/or in the solar radiation region, in particular a metallic functional layer based on silver or on a silver-containing metal alloy.

In this type of stack, the functional layer is thus positioned between two antireflective coatings each generally comprising several layers which are each made of a dielectric material of the nitride type, in particular silicon nitride or aluminum nitride, or of the oxide type. From the optical viewpoint, the aim of these coatings, which frame the metallic functional layer, is to render this metallic functional layer "anti reflective".

A blocker coating is, however, sometimes inserted between a or each antireflective coating and the metallic functional layer; the blocker coating positioned under the functional layer in the direction of the substrate protects it during a possible high-temperature heat treatment, of the bending and/or tempering type, and the blocker coating positioned on the functional layer on the opposite side from the substrate protects this layer from possible degradation during the deposition of the upper antireflective coating and during a possible high-temperature heat treatment, of the bending and/or tempering type.

It is known, for example from the European patent application No. EP 718 250, that a "wetting" dielectric layer based on zinc oxide positioned directly under a silver-based metallic functional layer, in the direction of the carrying substrate, promotes the achieving of an appropriate crystallographic state of the metallic functional layer while exhibiting the advantage of being able to withstand a high-temperature bending or tempering heat treatment.

Furthermore, this document discloses the favorable effect of the presence of a layer deposited in the metallic form directly on and in contact with the silver-based functional layer for the protection of the functional layer during the deposition of the other layers on top and during the a high-temperature heat treatment. A person skilled in the art knows this type of layer under the generic term of "blocker layer" or "blocker".

There are additionally known, from the international patent application No. WO 2010/142926, different solutions for carrying out a flash heating of a stack of thin layers comprising one or more silver-based functional layers. The treatment by flash heating makes it possible to improve the quality of the metallic functional layer and thus to reduce the emissivity (which is directly related to the sheet resistance) and the use of an absorbent intermediate layer makes it possible to increase the absorption of the stack during the treatment in order for it to be short but effective. As the absorbent intermediate layer becomes transparent during the treatment, the optical characteristics of the stack after treatment are advantageous (a high light transmission can in particular be obtained).

The aim of the invention is to succeed in overcoming the disadvantages of the prior art by developing a novel type of stack of layers functional monolayer or functional multilayers, which stack exhibits a reduced sheet resistance (and thus a reduced emissivity) after a (or two or more) high-temperature heat treatment(s) of the bending and/or tempering and/or annealing and/or flash heating type.

It has been discovered that, surprisingly, the presence of a nickel oxide layer in such a stack has very favorable effects on reducing the sheet resistance of the stack in the case where this nickel oxide layer is directly in contact with and on a silver-based metallic functional layer.

A subject-matter of the invention is thus, in its broadest sense, a transparent substrate as claimed in claim 1. This substrate is provided, on a main face, with a stack of thin layers comprising at least one, indeed even just one, metallic functional layer having properties of reflection in the infrared region and/or in the solar radiation region, in particular based on silver or on silver-containing metal alloy, and two antireflective coatings, said antireflective coatings each comprising at least one dielectric layer, said functional layer being positioned between the two antireflective coatings, at least one nickel oxide $Ni_xO$ layer being located on and in contact with the functional layer starting from the substrate, with a physical thickness of said nickel oxide $Ni_xO$ layer of at least 0.3 nm, indeed even between 0.6 and 8.0 nm, indeed even between 1.0 and 5.0 nm.

"Metallic layer" within the meaning of the present invention should be understood as meaning that the layer comprises neither oxygen nor nitrogen.

"Coating" within the meaning of the present invention should be understood as meaning that there may be a single layer or several layers of different materials within the coating.

"In contact" is understood to mean, within the meaning of the invention, that no layer is interposed between the two layers under consideration.

"Based on" is understood to mean, within the meaning of the invention, that the element or the material thus denoted is present at more than 50 atom % in the layer under consideration.

Advantageously, the single (or the) metallic functional layer(s) having properties of reflection in the infrared region and/or in the solar radiation region is (or are) a (or two or more) continuous layer(s).

In fact, according to the invention, the nickel oxide $Ni_xO$ layer does not comprise any other element than Ni and O. The material constituting this layer can be described as: "pure nickel oxide".

The expression "$Ni_xO$" is targeted at the fact that there may be $Ni_1O_1$ but also that the constituent material of the layer may not exhibit precisely this stable stoichiometry:

the material of the layer may be slightly superstoichiometric in Ni, for example with a $0.8 \leq x < 1$ and in particular $0.8 \leq x \leq 0.95$, or the material of the layer may be slightly substoichiometric in Ni, for example with a $1<x\leq1.2$ and in particular $1.05\leq x\leq1.2$.

In a specific alternative form, said nickel oxide $Ni_xO$ layer exhibits an x between 1.2 and 0.5, indeed even between 0.9 and 0.6.

In a very specific alternative form, a layer based on zinc oxide is located above and in contact with said nickel oxide $Ni_xO$ layer.

Preferably, a nickel oxide $Ni_yO$ layer is located above and in contact, and/or is located below and in contact, with said nickel oxide $Ni_xO$ layer, a nickel oxide layer closest to said functional layer being less oxidized than another nickel oxide layer which is more distant from said functional layer starting from the substrate. This is because a more oxidized nickel oxide layer is a better blocker and a less oxidized nickel oxide layer is a better light absorbent.

Said underlying antireflective and overlying antireflective coatings preferably, in addition, each comprise at least one dielectric layer based on silicon nitride, optionally doped using at least one other element, such as aluminum.

Furthermore, it is possible for another nickel oxide $Ni_xO$ layer to be in the stack, located under the functional layer and in contact with the functional layer, with a physical thickness of said nickel oxide $Ni_xO$ layer of at least 0.3 nm, indeed even between 0.6 and 8.0 nm, indeed even between 1.0 and 5.0 nm. The x is preferably the same for these two nickel oxide $Ni_xO$ layers in order to facilitate the deposition.

Otherwise, it is possible for a metallic layer, in particular comprising nickel and chromium, to be located under and in contact with the functional layer, with a physical thickness of said metallic layer of at least 0.3 nm, indeed even between 0.6 and 8.0 nm, indeed even between 1.0 and 5.0 nm.

In addition, it is possible for another nickel oxide $Ni_xO$ layer to be located under said functional layer in the direction of the substrate, with interposition of at least one layer or of just one layer made of a different material between said nickel oxide $Ni_xO$ layer and said functional layer, this nickel oxide $Ni_xO$ layer preferably exhibiting a thickness of between 0.3 and 10.0 nm, indeed even between 0.6 and 8.0 nm, indeed even between 1.0 and 5.0 nm. This can also have a favorable effect on the crystallographic state of the metallic functional layer and thus the sheet resistance of the stack.

The stack can comprise a final layer (overcoat), that is to say a protective layer. This protective layer preferably exhibits a physical thickness of between 0.5 and 10 nm.

The glazing according to the invention incorporates at least the substrate carrying the stack according to the invention, optionally in combination with at least one other substrate. Each substrate can be clear or tinted. One of the substrates at least in particular can be made of bulk-tinted glass. The choice of coloration type will depend on the level of light transmission and/or on the colorimetric appearance which are desired for the glazing once its manufacture has been completed.

The glazing according to the invention can exhibit a laminated structure, combining in particular at least two rigid substrates of the glass type by means of at least one sheet of thermoplastic polymer, in order to exhibit a structure of glass/stack of thin layers/sheet(s)/glass type. The polymer can in particular be based on polyvinyl butyral PVB, ethylene/vinyl acetate EVA, polyethylene terephthalate PET or polyvinyl chloride PVC.

The glazing can furthermore exhibit a structure of glass/stack of thin layers/polymer sheet(s) type.

The glazings according to the invention are capable of being subjected to a heat treatment without damage to the stack of thin layers. The are thus optionally bent and/or tempered.

The glazing can be bent and/or tempered while consisting of a single substrate, that provided with the stack. It is then a "monolithic" glazing. In the case where they are bent, in particular for the purpose of forming glazings for vehicles, the stack of thin layers is preferably found on a face which is at least partially nonplanar.

The glazing can also be a multiple glazing, in particular a double glazing, it being possible for at least the substrate carrying the stack to be bent and/or tempered. It is preferable in a multiple glazing configuration for the stack to be positioned so as to face the inserted gas-filled cavity. In a laminated structure, the stack can be in contact with the polymer sheet.

The glazing can also be a triple glazing consisting of three glass sheets separated in pairs by a gas-filled cavity. In a triple glazing structure, the substrate carrying the stack can be on face 2 and/or on face 5, when it is considered that the incident direction of the sunlight traverses the faces in increasing order of their number.

When the glazing is monolithic or multiple, of the double glazing, triple glazing or laminated glazing type, at least the substrate carrying the stack can be made of bent or tempered glass, it being possible for this substrate to be bent or tempered before or after the deposition of the stack.

Advantageously, the present invention thus makes it possible to produce a stack of thin layers metallic functional monolayer or metallic functional multilayers which exhibits a lower sheet resistance after heat treatment, without detrimentally influencing the optical parameters of the stack.

Figure 2:
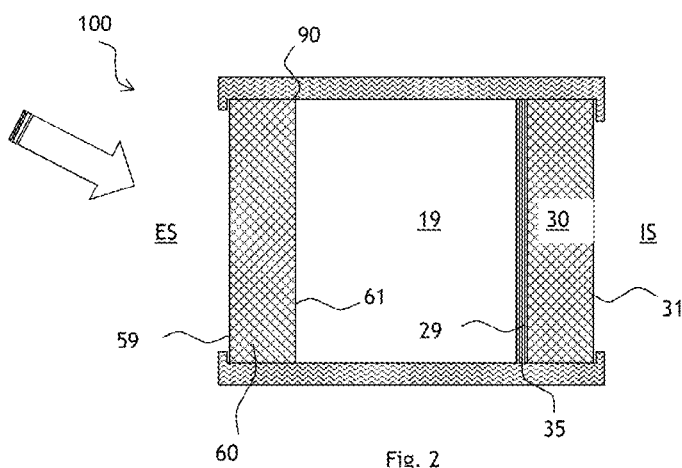
Figure 3:
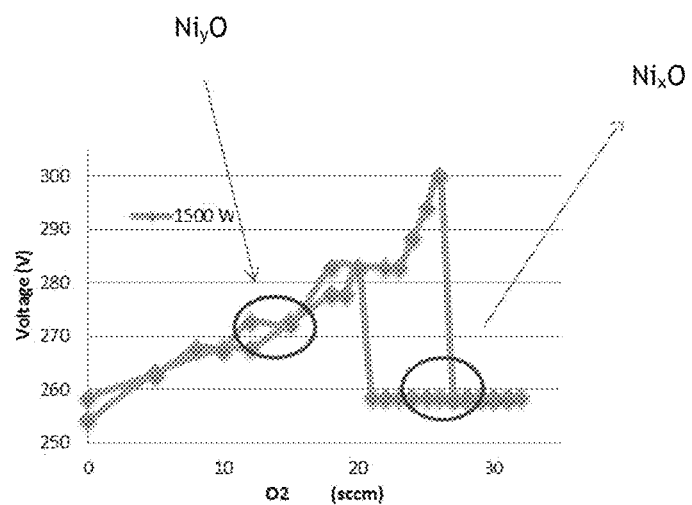

The details and advantageous characteristics of the invention emerge from the following nonlimiting examples, illustrated by means of the appended figures which illustrate:

in FIG. 1, a functional monolayer stack according to the invention, the functional layer being deposited directly on an underblocker coating and directly under an overblocker coating, the stack being illustrated during the treatment using a source which produces radiation;

in FIG. 2, a double glazing solution incorporating a functional monolayer stack; and in FIG. 3, the hysteresis curve of the nickel oxide deposited from a metal target in the presence of oxygen.

In FIGS. 1 and 2, the proportions between the thicknesses of the different layers or of the different elements are not rigorously respected in order to make them easier to read.

FIG. 1 illustrates a structure of a functional monolayer stack 35 according to the invention deposited on a face 29 of a transparent glass substrate 30, in which the single functional layer 140, in particular based on silver or on a silver-containing metal alloy, is positioned between two antireflective coatings, the underlying antireflective coating 120 located under the functional layer 140 in the direction of the substrate 30 and the overlying antireflective coating 160 positioned above the functional layer 140 on the opposite side from the substrate 30.

These two antireflective coatings 120, 160 each comprise at least one dielectric layer 122, 126; 162, 168 and preferably each comprise at least two dielectric layers: in each dielectric coating, a dielectric layer 126, 162, preferably based on zinc oxide, which is closer to the functional layer 140, and a dielectric layer 122, 168, preferably based on silicon nitride, further from the functional layer 140.

Optionally, on the one hand, the functional layer 140 can be deposited directly on an underblocker coating 130 positioned between the underlying antireflective coating 120 and the functional layer 140 and, on the other hand, the functional layer 140 can be deposited directly under an overblocker coating 150 positioned between the functional layer 140 and the overlying antireflective coating 160.

The underblocker and/or overblocker layers, although deposited in metallic form and presented as being metallic layers, are sometimes in practice oxidized layers since one of their functions (in particular for the overblocker layer) is to become oxidized during the deposition of the stack in order to protect the functional layer.

According to the invention, at least one nickel oxide $Ni_xO$ layer (the layer 155 in table 1 below) is located on and in contact with the functional layer 140 starting from the substrate 30, with a physical thickness of said nickel oxide $Ni_xO$ layer of at least 0.3 nm, indeed even between 0.6 and 8.0 nm, indeed even between 1.0 and 5.0 nm.

When a stack is used in a multiple glazing 100 of double glazing structure, as illustrated in FIG. 2, this glazing comprises two substrates 60, 30 which are held together by a frame structure 90 and which are separated from one another by an inserted gas-filled cavity 19. Each substrate 30, 60 thus respectively comprises an internal face 29, 61 in contact with the inserted gas-filled cavity 19, the other face 31, 59 of the substrate 30, 60 being in contact with the internal space IS and the external space ES respectively.

The glazing thus provides a separation between an external space ES and an internal space IS.

The stack can be positioned on face 3 (on the sheet furthest inside the building when considering the incident direction of the sunlight entering the building and on its face facing the gas-filled cavity).

FIG. 2 illustrates this positioning (the incident direction of the sunlight entering the building being illustrated by the double arrow) on face 3 of a stack of thin layers 35 positioned on an internal face 29 of the substrate 30 in contact with the inserted gas-filled cavity 19, the other face 31 of the substrate 30 being in contact with the internal space IS.

However, it can also be envisaged that, in this double glazing structure, one of the substrates exhibits a laminated structure.

For all the examples below, the conditions for deposition of the layers are:

| Layer | Target employed | Deposition pressure | Gas |
|---|---|---|---|
| $Si_3N_4$ | Si:Al at 92:8 wt % | $1.5 \times 10^{-3}$ mbar | $Ar/(Ar + N_2)$ at 22% |
| ZnO | Zn:O at 50:50 atom % | $2 \times 10^{-3}$ mbar | $Ar/(Ar + O_2)$ at 90% |
| NiCr | Ni:Cr at 80:20 atom % | $8 \times 10^{-3}$ mbar | Ar at 100% |
| $Ni_xO$ | Ni | $5 \times 10^{-3}$ mbar | $Ar/(Ar + O_2)$ at 87% |
| $Ni_yO$ | Ni | $5 \times 10^{-3}$ mbar | $Ar/(Ar + O_2)$ at 81% |
| Ag | Ag | $8 \times 10^{-3}$ mbar | Ar at 100% |

The layers deposited can thus be classified into four categories:

i—layers of antireflective/dielectric material exhibiting an n/k ratio over the entire wavelength range of the visible region of greater than 5: $Si_3N_4$, ZnO;

ii—metallic functional layers made of material having properties of reflection in the infrared region and/or in the solar radiation region: Ag; it has been observed that silver exhibits a ratio 0<n/k<5 over the entire wavelength range of the visible region and its bulk electrical resistivity is less than $10^{-6}$ Ω·cm;

iii—underblocker and overblocker layers intended to protect the functional layer from a modification to its nature during the deposition of the stack;

iv—nickel oxide $Ni_xO$ and $Ni_yO$ layers; FIG. 3 illustrates the conditions for deposition of these two layers.

It should be noted that a $Ni_1O_1$ ceramic target has also been tested and led to similar results to those found with the examples below.

In all the examples below, the stack of thin layers is deposited on a substrate made of clear soda-lime glass with a thickness of 4 mm of the Planiclear brand, distributed by Saint-Gobain.

In table 1, the "No." column shows the number of the layer and the second column shows the coating, in connection with the configuration of FIG. 1; the third column shows the material deposited for the layer of the first column.

In this table 1, the substrate 30 is located under the layer 122 and the layers of the examples are located in the order shown by the left-hand column, from the bottom upward starting from this substrate 30; the layers numbered in these tables which are not shown in FIG. 1 are thus localized in the examples in the same way as shown in table 1.

TABLE 1

| | | | Ex. | | | | | |
|---|---|---|---|---|---|---|---|---|
| No. | | | 1 | 50 | 51 | 52 | 53 | 54 |
| 168 | 160 | $Si_3N_4$ | 20 | 20 | 20 | 20 | 20 | 20 |
| 165 | | $Ni_xO$ | — | — | 1 | — | — | 1 |
| 162 | | ZnO | 5 | 5 | — | — | — | 5 |
| 156 | 150 | $Ni_yO$ | — | — | 1 | — | — | 1 |
| 155 | | $Ni_xO$ | — | 3 | 1 | 2 | 2 | — |
| 154 | | $Ni_yO$ | — | — | — | 1 | 1 | — |
| 152 | | NiCr | 1 | — | — | — | — | — |
| 140 | 140 | Ag | 10 | 10 | 10 | 10 | 10 | 10 |
| 130 | 130 | NiCr | 1 | 1 | 1 | 1 | — | 1 |
| 126 | 120 | ZnO | 5 | 5 | 5 | 5 | 5 | 5 |
| 122 | | $Si_3N_4$ | 20 | 20 | 20 | 20 | 20 | 20 |

In the series of examples of table 1, for examples 50 to 54, the nickel oxide layer 154 and/or 155 and/or 156 is in the overlying blocker coating 150 and is in contact with the metallic functional layer 140.

The nickel oxide $Ni_yO$ of the layer 154 or 156 is different from the nickel oxide $Ni_xO$ of the layer 155: with reference to FIG. 3, which illustrates the hysteresis curve of the nickel oxide deposited from a metal target in an oxidizing atmosphere (the abscissa shows the oxygen flow, in sccm, and the ordinate shows the voltage at the terminals of the target), the $Ni_xO$ is deposited under standard conditions resulting in an oxygen-rich oxide (in other words, superstoichiometric in oxygen, or stoichiometric in oxygen, indeed even slightly substoichiometric in oxygen), whereas the $Ni_yO$ is deposited under conditions resulting in a Ni-rich oxide (in other words, clearly substoichiometric in oxygen). The use of $Ni_yO$ results in a higher light absorption being obtained.

TABLE 2

| | Ex. | |
|---|---|---|
| | 1 | 50 |
| R (Ω/square) | 4.7 | 4.3 (−9%) |
| Abs (%) | 9.4 | 10.5 |

The characteristics of the substrate coated with the stack which are presented in table 2 consist of the measurement, after a tempering heat treatment at 650° C. for 10 minutes and then a cooling operation:

for R, of the sheet resistance measured as usual with a four-point probe, in ohms per square, and for Abs, of the light absorption in the visible region in %, measured according to illuminant D65 2°, on the side opposite the main face of the substrate on which the stack of thin layers is deposited.

The value in brackets indicates the improvement (the decrease) in the sheet resistance with respect to the reference consisting of example 1.

The heat treatment would have been able to consist of a forward progression of the substrate 30 at a rate of 10 m/min under a laser line 8. By way of example, such a laser line can have a width of 60 μm and a power of 25 W/mm with the laser line oriented perpendicularly to the face 29 and in the direction of the terminal layer of the stack, that furthest from the face 29, that is to say by positioning the laser line (illustrated by the straight black arrow) above the stack and by orienting the laser in the direction of the stack, as seen in FIG. 1.

Other tests have been carried out with a nickel oxide $Ni_xO$ layer 155 with a thickness of 1 nm and have given similar results.

Other tests have been carried out with a metallic functional layer made of silver with a thickness of 15 nm and have given similar results.

Furthermore, tests have been carried out in an attempt to understand if the method of deposition of the $Ni_xO$ layer 155, on the basis of example 50, could influence the improvements obtained. This is because a $Ni_xO$ layer can be obtained:

i. either by sputtering a metal target containing only Ni, in an atmosphere containing oxygen, indeed even, in addition, a neutral gas, such as argon;

ii. or by sputtering a "ceramic" target containing both Ni and oxygen, in an atmosphere containing a neutral gas, such as argon, indeed even, in addition, oxygen.

It has been found that similar results were obtained in both cases, with an identical $Ni_xO$ layer 155 thickness.

It has furthermore been found that the resistivity of the $Ni_xO$ deposited according to the case i above, before heat treatment, was of the order of 190 μΩ·cm, i.e. a value close to that of ITO (approximately 200 μΩ·cm) and much higher than the resistivity of the silver used for the functional layer 140, which is of the order of 3 μΩ·cm; after the heat treatment at 650° C. for 10 minutes, the resistivity of this same $Ni_xO$ deposited according to the case i above fell to approximately 30 μΩ·cm.

The mechanical strength of example 50 has been tested and compared with that of example 1: it is as good, indeed sometimes even better for high loads.

As a result of the low sheet resistance obtained and also of the good optical properties (in particular the light transmission in the visible region), it is furthermore possible to use the substrate coated with the stack according to the invention to produce a transparent electrode substrate.

Generally, the transparent electrode substrate may be suitable for any heated glazing, for any electrochromic glazing, any display screen, or also for a photovoltaic cell (or panel) and in particular for a transparent photovoltaic cell backsheet.

The present invention is described in the preceding text by way of example. It is understood that a person skilled in the art is able to produce different alternative forms of the invention without, however, departing from the scope of the patent as defined by the claims.

The invention claimed is:

1. A transparent substrate provided, on a main face, with a stack of thin layers comprising at least one, metallic functional layer having properties of reflection in the infrared region and/or in the solar radiation region, and two antireflective coatings said antireflective coatings each comprising at least one dielectric layer, said functional layer being positioned between the two antireflective coatings, and at least one nickel oxide $Ni_xO$ layer is located on and in contact with the functional layer starting from the substrate, with a physical thickness of said nickel oxide $Ni_xO$ layer of at least 0.3 nm, wherein said nickel oxide $Ni_xO$ layer is superstoichiometric in oxygen.

2. The substrate as claimed in claim 1, wherein said nickel oxide $Ni_xO$ layer exhibits an x between 0.9 and 0.5.

3. The substrate as claimed in claim 1, wherein a layer based on zinc oxide is located above and in contact with said nickel oxide $Ni_xO$ layer.

4. The substrate as claimed in claim 1, wherein a nickel oxide $Ni_xO$ layer is located above and in contact and/or below and in contact with said nickel oxide $Ni_xO$ layer, a nickel oxide layer closest to said functional layer being less oxidized than another nickel oxide layer which is more distant.

5. The substrate as claimed in claim 1, wherein said underlying antireflective and overlying antireflective coatings each comprise at least one dielectric layer based on silicon nitride.

6. The substrate as claimed in claim 1, wherein a nickel oxide $Ni_xO$ layer is located under and in contact with the functional layer, with a physical thickness of said nickel oxide $Ni_xO$ layer of at least 0.3 nm.

7. The substrate as claimed in claim 6, wherein the thickness of said nickel oxide $Ni_xO$ layer is between 1.0 and 5.0 nm.

8. The substrate as claimed in claim 1, wherein a metallic layer is located under and in contact with the functional layer, with a physical thickness of said metallic layer of at least 0.3 nm.

9. The substrate as claimed in claim 8, wherein the thickness of said metallic layer is between 1.0 and 5.0 nm.

10. The substrate as claimed in claim 1, wherein a nickel oxide $Ni_xO$ layer is located under said functional layer in the direction of the substrate, with interposition of at least one layer or of just one layer made of a different material between said nickel oxide $Ni_xO$ layer and said functional layer, the nickel oxide $Ni_xO$ layer exhibiting a thickness of between 0.3 and 10.0 nm.

11. The substrate as claimed in claim 10, wherein the thickness of said nickel oxide $Ni_xO$ layer is between 1.0 and 5.0 nm.

12. The substrate as claimed in claim 1, wherein the functional layer is based on silver or on silver-containing metal alloy.

13. The substrate as claimed in claim 1, wherein the thickness of said nickel oxide $Ni_xO$ layer is between 0.6 and 8.0 nm.

14. The substrate as claimed in claim 1, wherein the thickness of said nickel oxide $Ni_xO$ layer is between 1.0 and 5.0 nm.

15. The substrate as claimed in claim 1, wherein said nickel oxide $Ni_xO$ layer exhibits an x between 0.9 and 0.6.

16. The substrate as claimed in claim 1, wherein said underlying antireflective and overlying antireflective coatings each comprise at least one dielectric layer based on silicon nitride, doped using aluminum.

17. A glazing comprising at least one substrate as claimed in claim 1.

18. The glazing as claimed in claim 17, mounted as a monolithic unit or as a multiple glazing unit of the double glazing or triple glazing or laminated glazing type, wherein at least the substrate carrying the stack is bent and/or tempered.

19. The glazing as claimed in claim 17, further comprising at least one other substrate.

20. A method of using the substrate as claimed in claim 1, comprising producing a transparent electrode of a heated glazing or of an electrochromic glazing or of a lighting device or of a display device or of a photovoltaic panel from the substrate.

\* \* \* \* \*